(12) United States Patent
Fujimoto et al.

(10) Patent No.: US 7,190,076 B2
(45) Date of Patent: Mar. 13, 2007

(54) ELECTRODE FOR P-TYPE GROUP III NITRIDE COMPOUND SEMICONDUCTOR LAYER AND METHOD FOR PRODUCING THE SAME

(75) Inventors: Ippei Fujimoto, Kashihara (JP); Tsutomu Sekine, Kyoto (JP); Miki Moriyama, Kyoto (JP); Masanori Murakami, Kyotanabe (JP); Naoki Shibata, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 13 days.

(21) Appl. No.: 10/695,453

(22) Filed: Oct. 29, 2003

(65) Prior Publication Data

US 2004/0130025 A1    Jul. 8, 2004

(30) Foreign Application Priority Data

Oct. 31, 2002    (JP) .......................... P2002-318469

(51) Int. Cl.
| H01L 23/48 | (2006.01) |
| H01L 29/40 | (2006.01) |
| H01L 29/20 | (2006.01) |
| H01L 33/00 | (2006.01) |
| H01L 29/02 | (2006.01) |

(52) U.S. Cl. .............................. 257/744; 257/E29.144; 257/745; 257/123; 257/94; 257/13; 257/627; 257/82; 257/85; 257/90; 257/96; 257/336; 257/77; 257/14; 257/190

(58) Field of Classification Search ........ 257/E29.144, 257/744, 745, 123, 94, 103, 627, 82, 85, 257/90, 96, 336, 77, 628, 341, 335, 14, 98, 257/190
See application file for complete search history.

(56) References Cited

U.S. PATENT DOCUMENTS

| 5,369,290 | A | * | 11/1994 | Kawasaki et al. .......... 257/103 |
| 5,548,131 | A | * | 8/1996 | Tokunaga et al. ............. 257/64 |
| 5,602,418 | A | * | 2/1997 | Imai et al. .................. 257/627 |
| 5,751,752 | A | * | 5/1998 | Shakuda .................. 372/45.01 |
| 5,804,839 | A | * | 9/1998 | Hanaoka et al. ............ 257/103 |
| 5,913,986 | A | * | 6/1999 | Matsuyama ................. 136/255 |
| 6,316,785 | B1 | * | 11/2001 | Nunoue et al. ................ 257/14 |
| 6,320,216 | B1 | * | 11/2001 | Nomoto ...................... 257/315 |

(Continued)

FOREIGN PATENT DOCUMENTS

JP        6-314822        11/1994

(Continued)

*Primary Examiner*—Alexabder Oscar Williams
(74) *Attorney, Agent, or Firm*—McGinn IP Law Group, PLLC

(57) ABSTRACT

A GaN layer is formed on a sapphire substrate through an AlN buffer layer and doped with Mg to prepare a laminate (referred to as "GaN substrate"). A metal (Pt and Ni) electrode 50 nm thick is formed on the GaN substrate by (1) vapor deposition after the GaN substrate is heated to a temperature of 300° C. or by (2) vapor deposition while the GaN substrate is left at room temperature. (3) The electrode obtained in (2) is heated to 300° C. in a nitrogen atmosphere. The contact resistance of the electrode obtained in (1) is lower by two or three digits than that of the electrode obtained in (2) or (3). That is, the electric characteristic of the electrode obtained in (1) is improved greatly.

20 Claims, 4 Drawing Sheets

U.S. PATENT DOCUMENTS

| | | | |
|---|---|---|---|
| 6,600,179 B2* | 7/2003 | Quaglietta et al. | 257/197 |
| 6,744,104 B1* | 6/2004 | Aoki et al. | 257/372 |
| 6,759,684 B2* | 7/2004 | Fukuda et al. | 257/77 |
| 6,770,519 B2* | 8/2004 | Ito et al. | 438/197 |
| 6,779,837 B1* | 8/2004 | Cooney et al. | 296/217 |
| 6,784,435 B2* | 8/2004 | Yagi et al. | 250/372 |
| 2002/0006681 A1* | 1/2002 | Yamanaka et al. | 438/29 |
| 2003/0001206 A1* | 1/2003 | Negoro et al. | 257/336 |
| 2003/0013280 A1* | 1/2003 | Yamanaka | 438/487 |
| 2003/0022473 A1* | 1/2003 | Matsumoto et al. | 438/514 |
| 2004/0014279 A1* | 1/2004 | Zheng | 438/255 |
| 2004/0056304 A1* | 3/2004 | Ahmed et al. | 257/336 |
| 2004/0222493 A1* | 11/2004 | Sato et al. | 257/532 |
| 2005/0121693 A1* | 6/2005 | Udagawa et al. | 257/190 |
| 2005/0136633 A1* | 6/2005 | Taylor et al. | 438/592 |

FOREIGN PATENT DOCUMENTS

| | | | |
|---|---|---|---|
| JP | 8-264478 | | 10/1996 |
| JP | 11-74558 | * | 3/1999 |
| JP | 2001-5338 | * | 2/2001 |

* cited by examiner d = 4, 8, 16, 24 μm

US 7,190,076 B2

ELECTRODE FOR P-TYPE GROUP III NITRIDE COMPOUND SEMICONDUCTOR LAYER AND METHOD FOR PRODUCING THE SAME

The present application is based on Japanese Patent Application No. 2002-318469, which is incorporated herein by reference.

BACKGROUND OF THE INVENTION

1. Field of the Invention

The present invention relates to an electrode low in contact resistance to a p-type Group III nitride compound semiconductor. It also relates to a method for producing an electrode with reduced contact resistance. Incidentally, the concept "Group III nitride compound semiconductors" includes semiconductors represented by the general formula: $Al_xGa_yIn_{1-x-y}N$ ($0 \leq x \leq 1$, $0 \leq y \leq 1$, $0 \leq x+y \leq 1$) which includes binary compounds such as AlN, GaN and InN, ternary compounds such as $Al_xGa_{1-x}N$, $Al_xIn_{1-x}N$ and $Ga_xIn_{1-x}N$ ($0<x<1$ each), and quaternary compounds such as $Al_xGa_yIn_{1-x-y}N$ ($0<x<1$, $0<y<1$, $0<x+y<1$).

2. Description of the Related Art

When, for example, Group III nitride compound semiconductors are applied to light-emitting devices, the Group III nitride compound semiconductors are direct transition type semiconductors having a wide emission spectrum range of from ultraviolet to red. The Group III nitride compound semiconductors are applied to light-emitting diodes (LEDs), laser diodes (LDs) and so on. Because each Group III nitride compound semiconductor has a wide band gap, there is an expectation that devices using Group III nitride compound semiconductors will operate more stably at a high temperature than devices using other semiconductors. For this reason, the application of Group III nitride compound semiconductors to transistors such as FETs has been developed actively. In addition, because each Group III nitride compound semiconductor contains no arsenic (As) as a main component, there is an expectation that Group III nitride compound semiconductors will be developed to various semiconductor devices for general purposes from an environmental aspect.

In a compound semiconductor, it is usually impossible to obtain an ohmic contact when metal is formed simply on a surface of the semiconductor. Therefore, after a metal film is formed on the compound semiconductor, alloying is made by a heat treatment (sintering) to diffuse metal into the semiconductor to there by obtain an ohmic contact. Particularly in a p-type Group III nitride compound semiconductor, even in the case where resistance is reduced by a heat treatment such as electron beam irradiation, the resistivity of the p-type Group III nitride compound semiconductor is still higher than the resistivity of an n-type Group III nitride compound semiconductor. Accordingly, for example, in a light-emitting device, there is little lateral spread of a current in the p-type layer, so that light is emitted only just under the electrode. Therefore, a current diffusing electrode formed in such a manner that films of nickel (Ni) and gold (Au) each having a thickness of the order of tens of nm are laminated and heat-treated has been proposed as an electrode having both light-transmitting characteristic and ohmic characteristic (e.g., see Patent Document 1). Even in this case, when, for example, the electrode for p-type gallium nitride (GaN) is composed of Ni and Au, the contact resistivity pc of the electrode is high to be $7 \times 10^{-3}/cm^2$ in the present circumstances.

Incidentally, as described above, in the compound semiconductor, it is impossible to obtain an ohmic junction when metal is formed simply on the semiconductor surface, so that simple deposition of metal generally brings Schottky characteristic. It is conceived that this is because a Schottky barrier $\Phi_B$ ($\Phi_B = (X+E_g) - \Phi_m$) to movement of a carrier is formed in a boundary between the compound semiconductor and the metal as shown in FIG. 1 (e.g., see Non-Patent Document 1).

On the other hand, oxide and other deposits are present on a surface of the compound semiconductor, so that these deposits cause increase in contact resistance between the compound semiconductor and the metal. To solve this problem, for example, a chemical treatment and a sputtering treatment using an inert gas have been proposed (e.g., see Patent Document 2).

[Patent Document 1]
Unexamined Japanese Patent Publication No. Hei-6-314822

[Patent Document 2]
Unexamined Japanese Patent Publication No. Hei-8-264478

[Non-Patent Document 1]
Tetsuji Imai et al., "Compound Semiconductor Devices [II]", Kogyo Chosakai Publishing Co., Ltd., pp.73–76

It is said that reduction in the Schottky barrier $\Phi_B$ or the width of a depletion layer formed in the boundary between the p-type semiconductor and the metal is indispensable for reduction in contact resistance between the compound semiconductor and the metal and further leads to greater reduction in contact resistivity at the time of formation of an ohmic junction based on a heat treatment after that. In the present circumstances, essential issues such as the substance of the compound semiconductor/metal boundary, the relation with the metal boundary structure, and so on, are not yet exactly known. It is an urgent necessity to settle the essential issues.

SUMMARY OF THE INVENTION

The present inventors have made eager investigation into the essential issues such as the substance of the compound semiconductor (especially, Group III nitride compound semiconductor)/metal boundary and the relation with the metal boundary structure and have made an examination of orientation of a metal film formed on the semiconductor, height of a Schottky barrier and electric characteristic between the compound semiconductor and the metal while paying attention to the orientation of the metal film. As a result, the invention is accomplished. That is, the invention is developed to solve the problem and an object of the invention is to provide an electrode low in contact resistance to p-type Group III nitride compound semiconductor. Another object of the invention is to provide a method for producing an electrode having reduced contact resistance.

To solve the problem, the invention provides an electrode for p-type Group III nitride compound semiconductor, including a film at least containing polycrystalline metal. Preferably, the polycrystalline metal has such a fiber structure that crystal planes of crystal grains are oriented. This is because, when the polycrystalline metal has a fiber structure, crystal grain boundary density decreases so that the quantity of defects in the metal/semiconductor boundary decreases. Preferably, the polycrystalline metal has large crystal grains. As a method to achieve these matters, according to the invention, there is provided a method of producing an electrode for p-type Group III nitride compound semiconductor, including the step of forming a film at least containing polycrystalline metal on a p-type Group III nitride compound semiconductor in the condition that a semiconductor device having the p-type Group III nitride compound semiconductor is heated. According to this method, the metal film formed on the p-type Group III nitride compound semiconductor can contain the crystal having such a fiber structure that crystal planes of crystal grains are oriented. As the percentage occupied by such a crystal with a fiber structure increases, the orientation force of the metal film increases. The polycrystal in the metal film has such a fiber structure that crystal faces with closed packed planes are oriented. As a result, the height of the Schottky barrier between the compound semiconductor (especially, Group III nitride compound semiconductor) and the. metal can be reduced by the strong orientation force of the metal, so that the value of contact resistance in the boundary between the p-type Group III nitride compound semiconductor and the metal can be reduced greatly.

DETAILED DESCRIPTION OF THE PREFERRED EMBODIMENTS

Figure 1:
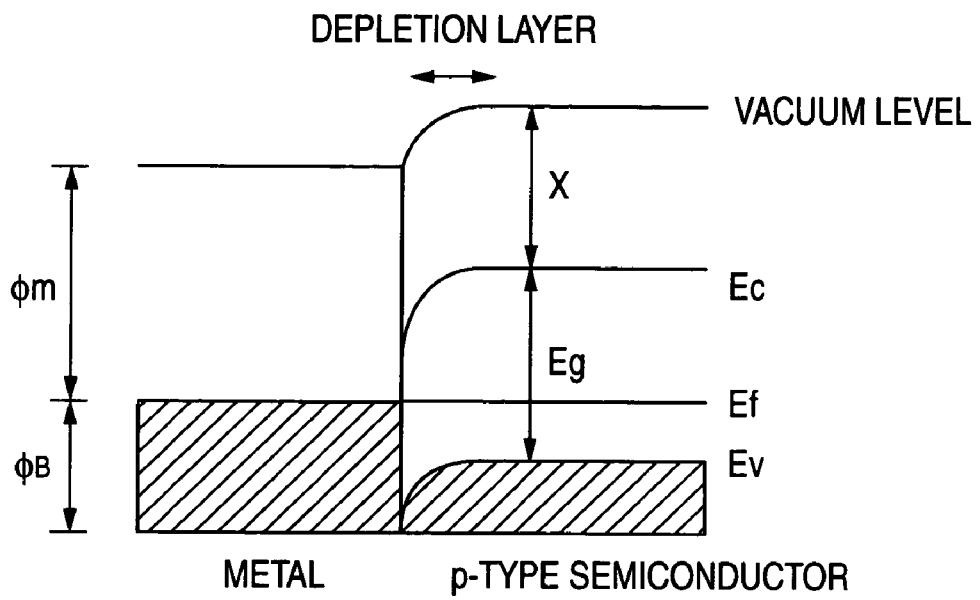
FIG. 1 shows a current transporting mechanism in a metal/semiconductor boundary.
Figure 2:
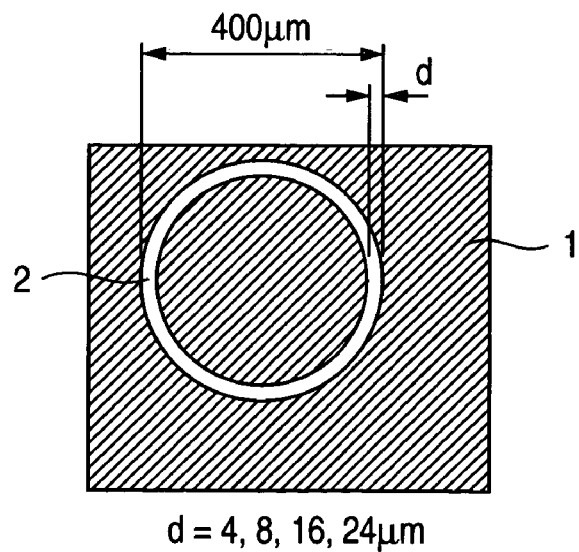
FIG. 2 shows a Marlow-Das type photolithography pattern for evaluation.

The invention will be described below on the basis of a specific embodiment thereof. A Marlow-Das type pattern (shaped like a circular ring with a center point) of $SiO_2$ using photolithography was used as a metal electrode-forming pattern (FIG. 2). Here, the width d of the circular ring ($SiO_2$-forming portion) was set at 4, 8, 16 or 24 μm. Gallium nitride (GaN) was used as a Group III nitride compound semiconductor (e.g., 640). A 4 μm-thick layer of GaN (e.g., 640) was formed on a sapphire substrate (e.g., 650) using a face A (e.g., 635) as a principal surface with interposition of a low-temperature deposited buffer layer of aluminum nitride (AlN) (e.g., 645) by a metal organic chemical-vapor deposition method (MOCVD method). A 0.5 μm-thick layer of GaN doped with magnesium (Mg) to be formed as a p-type semiconductor (e.g., 630) was further formed on the GaN layer (e.g., 640). The hole density of the p-type GaN layer (e.g., 630) was $5 \times 10^{17}$ cm$^{-3}$. Incidentally, the laminate composed of the sapphire substrate (e.g., 650), AlN (e.g., 645), GaN (e.g., 640) and p-type GaN (e.g., 630) is hereinafter referred to as "GaN" substrate (e.g., 660). Evaluation was carried out by measurement of contact resistance $R_0$ according to a current (I)-voltage (V) method and structural analysis of the metal film (e.g., 610) according to XRD.

The GaN substrate (e.g., 660) having a p-type GaN (e.g., 630) surface cleaned with hydrochloric acid was placed in a chamber of an evaporation system. Then, on the GaN substrate (e.g., 660) heated to a temperature of 300° C., a 50 nm-thick metal layer (e.g., 610) was vapor-deposited by an electron beam vapor deposition method. The deposited metals were two kinds of metals, namely, platinum (Pt) and nickel (Ni). Incidentally, a sample formed with the same film thickness without heating the GaN substrate (e.g., 660), that is, at room temperature (Comparative Example 1) and a sample heat-treated in a nitrogen ($N_2$) atmosphere at 300° C. for 30 minutes after that (Comparative Example 2) were prepared as Comparative Examples.

Tables 1 and 2 show results of the XRD measurement. Table 1 shows the case of Pt. Table 2 shows the case of Ni. Although spectra are not shown, no peak except (111) and (222) was observed in each of the cases of Pt and Ni. As is obvious from Tables 1 and 2, a large difference between this embodiment and Comparative Examples 1 and 2 appears in the intensity of (111) and the half-value width thereof. When, for example, Pt was vapor-deposited on the GaN substrate heated to a temperature of 300° C., the peak intensity of (111) and the half-value width thereof in this embodiment were 98534 and 0.4° respectively whereas the peak intensity of (111) and the half-value width thereof in Comparative Example 1 (room temperature formation) were 3666 and 2.5° respectively and the peak intensity of (111) and the half-value width thereof in Comparative Example 2 (room temperature formation→300° C. heat treatment) were 32061 and 2.2° respectively. Even when a heat treatment at 300° C. was carried out in the same manner, a large difference appeared between the case where the heat treatment was carried during formation and the case where the heat treatment was carried after formation. The same result as in the case of Pt was obtained in the case of Ni. It is obvious that the (111) orientation of crystal is intensified, that is, the percentage occupied by the crystal having such a fiber structure that crystal planes of crystal grains are oriented increases when the substrate is heated during formation. Incidentally, it is conceived that the (111) orientation is intensified in both Pt and Ni because both Pt and Ni have a face-centered cubic structure (fcc). Incidentally, in the case of a body-centered cubic structure (bcc), it is guessed that the (100) orientation is intensified.

TABLE 1

| | Pt (111) intensity | Pt (111) half-value width |
|---|---|---|
| This invention (substrate heating and vapor deposition) | 98534 | 0.4° |
| Comparative Example 1 (room temperature vapor deposition) | 3666 | 2.5° |
| Comparative Example 2 (room temperature vapor deposition → heating) | 32061 | 2.2° |

TABLE 2

| | Ni (111) intensity | Ni (111) half-value width |
|---|---|---|
| This invention (substrate heating and vapor deposition) | 19998 | 0.5° |
| Comparative Example 1 (room temperature vapor deposition) | 3135 | 1.7° |
| Comparative Example 2 (room temperature vapor deposition → heating) | 5473 | 1.1° |

Figure 3:
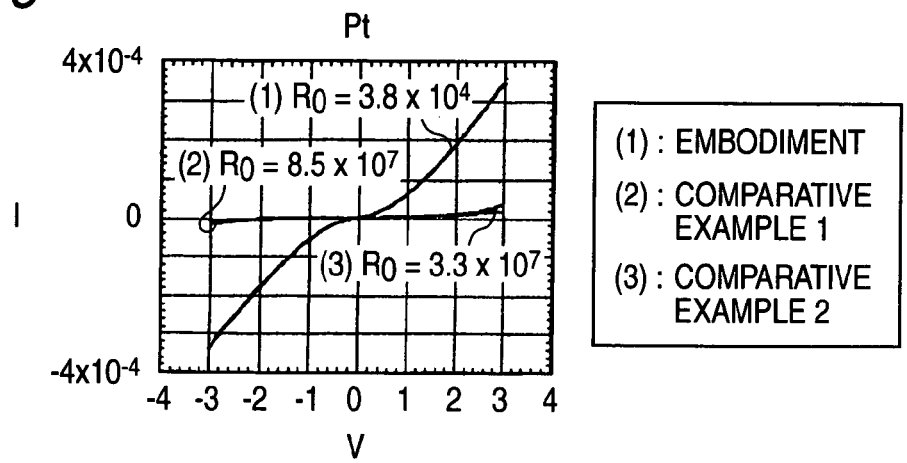
FIG. 3 is an I-V characteristic graph in the case of Pt.
Figure 4:
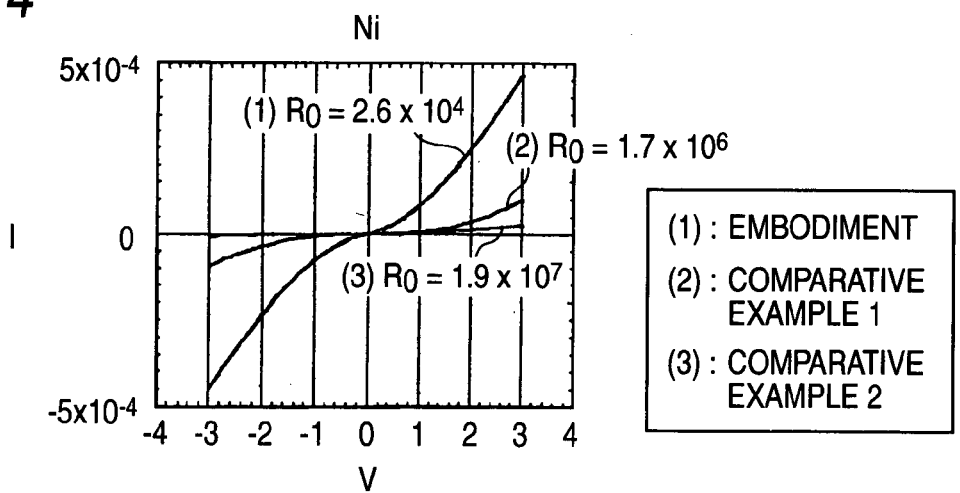
FIG. 4 is an I-V characteristic graph in the case of Ni.

FIGS. 3 and 4 show results of the I-V characteristic. FIG. 3 shows the case of Pt. FIG. 4 shows the case of Ni. It is obvious from FIGS. 3 and 4 that a large difference between this embodiment and Comparative Examples 1 and 2 appears in the value of contact resistance $R_O$ calculated on the basis of the I-V characteristic. When, for example, Pt was vapor-deposited on the GaN substrate heated to a temperature of 300° C., the value of contact resistance $R_O$ in this embodiment was $3.8 \times 10^4 \Omega$ whereas the value of contact resistance $R_O$ in Comparative Example 1 (room temperature formation) was $8.5 \times 10^7 \Omega$ and the value of contact resistance $R_O$ in Comparative Example 2 (room temperature formation→300° C. heat treatment) was $3.3 \times 10^7 \Omega$. When Ni was vapor-deposited on the GaN substrate heated to a temperature of 300° C., the value of contact resistance $R_O$ in this embodiment was $2.6 \times 10^4 \Omega$ whereas the value of contact resistance $R_O$ in Comparative Example 1 (room temperature formation) was $1.7 \times 10^6 \Omega$ and the value of contact resistance $R^O$ in Comparative Example2 (room temperature formation→300° C. heat treatment) was $1.9 \times 10^7 \Omega$. The result in the case of Ni was the same as that in the case of Pt. It is obvious that the value of contact resistance is reduced by two or three digits to improve electric characteristic remarkably when the substrate is heated during formation.

Figure 5:
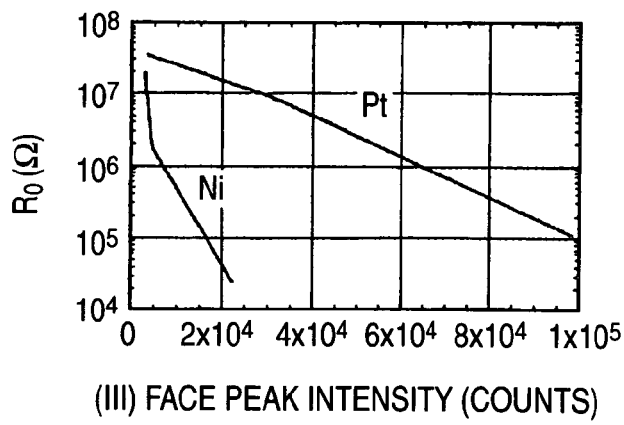
FIG. 5 is a graph showing the relation between (111) peak intensity and value of contact resistance $R_0$ of each metal film.
Figure 6:
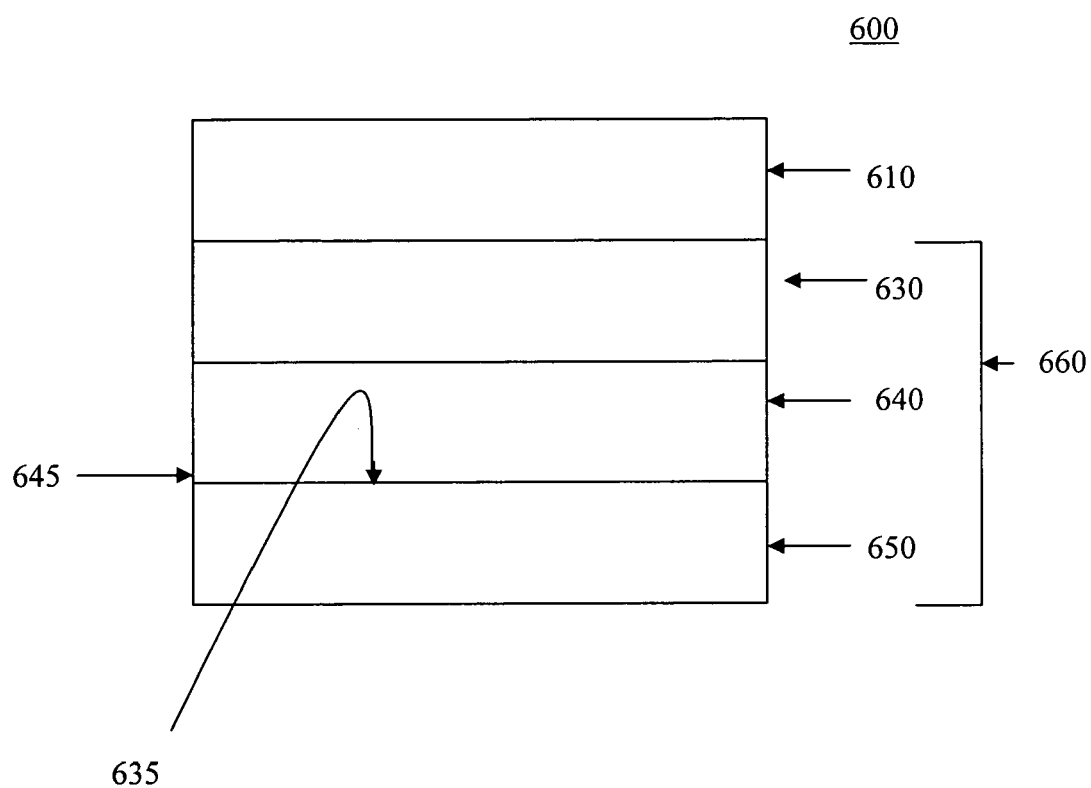
FIG. 6 illustrates an exemplary aspect of a device 600 according to the present invention.

FIG. 5 shows the case where (111) peak intensity is taken as the horizontal axis and value of contact resistance $R_O$ as the vertical axis on the basis of the aforementioned results. Incidentally, FIG. 5 shows the fact that the percentage occupied by the crystal having such a fiber structure that crystal planes of crystal grains are oriented (grains with (111) fiber structure) in the film increases as the (111) intensity on the horizontal axis increases. It is obvious from FIG. 5 that the percentage occupied by such a crystal with a fiber structure in the metal film is correlated with the value of contact resistance R0. It is proved that electric characteristic varies according to the degree of orientation of the metal, and that, particularly in a metal having a fcc structure, the value of contact resistance in the metal/GaN boundary decreases rapidly as the (111) orientation force increases.

Although GaN was used as the p-type Group III nitride compound semiconductor in this embodiment, similar results except variations in respective values were also obtained in the case where another p-type Group III nitride compound semiconductor such as AlGaN or GaInN was used. Although either Pt or Ni was used as the metal in this embodiment, it is guessed that similar results can be obtained in the case where a transition metal such as palladium (Pd), chromium (Cr) or iron (Fe) is used. In addition, the degree of large grains in the invention is preferably selected to be not smaller than the film thickness.

Figure 7:
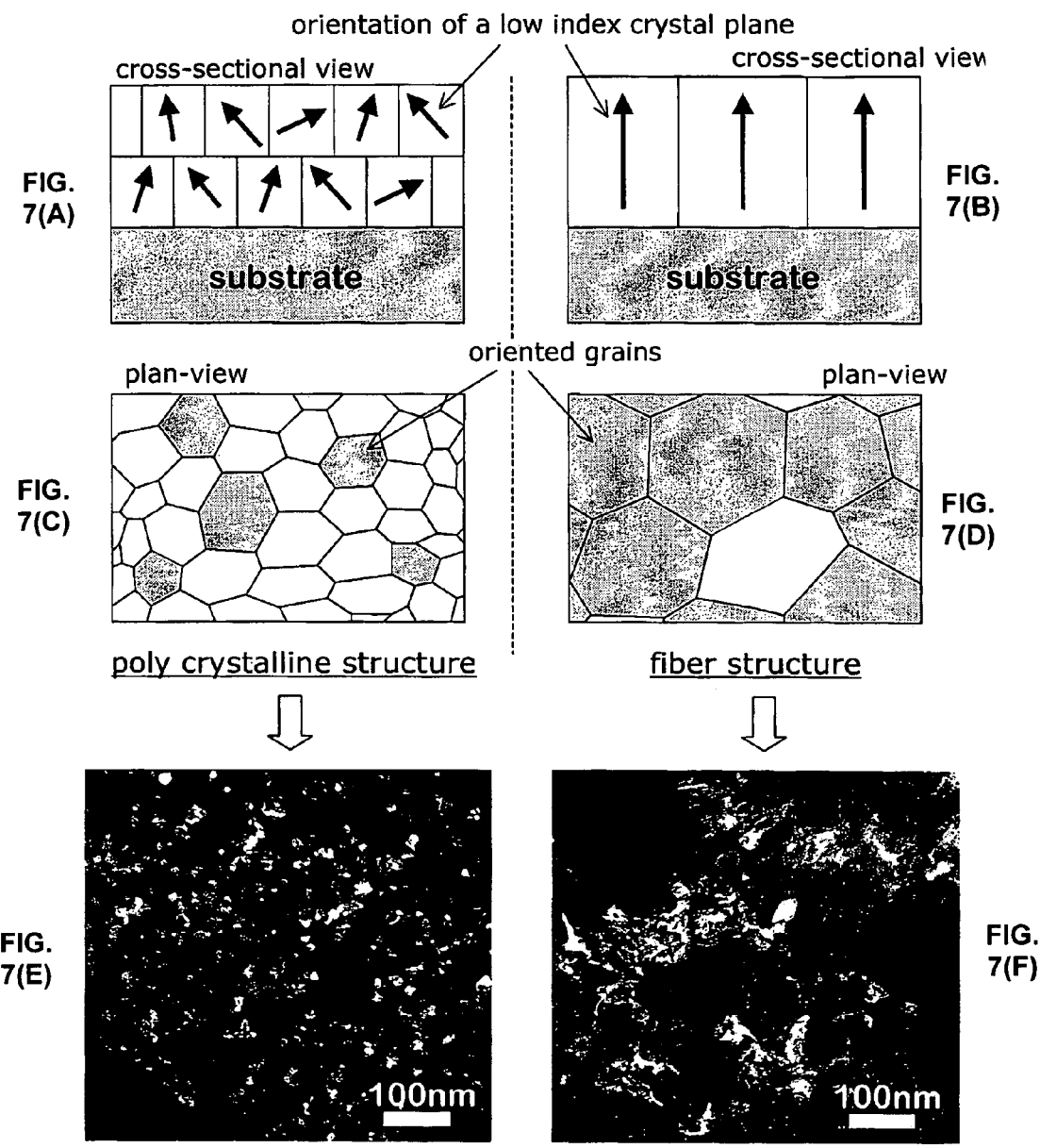
FIGS. 7(A)–(F) illustrate cross-sectional views, plan-views, and dark-field plan views of exemplary aspects of the device 600, according to the present invention.

FIGS. 7(A) and 7(B) exemplarily illustrate cross-sections of polycrystalline metal showing the orientation of a low crystal plane (e.g., oriented crystal planes of crystal grains), according to exemplary aspects of the present invention.

FIGS. 7(C) and 7(D) exemplarily illustrate plan-view of polycrystalline metal showing the orientation of crystal grains (e.g., oriented crystal faces including closed packed planes), according to exemplary aspects of the present invention.

FIG. 7(E) exemplarily illustrates a dark-field plan-view TEM micrograph of a Pt film deposited on a p-GaN substrate at room temperature, according to exemplary aspects of the present invention. The average grain size is approximately 10 nm.

FIG. 7(F) exemplarily illustrates a dark-field plan-view TEM micrograph of a Pt film deposited on a p-GaN substrate at 573K, according to exemplary aspects of the present invention. The average grain size is greater 100 nm.

Although the substrate was heated to a temperature of 300° C. during formation, the substrate temperature is preferably selected to be not lower than 200° C. and not higher than lower one of the decomposition temperature of the semiconductor and the melting point of the metal. This is because a remarkable effect of the invention can be obtained when the substrate temperature is in the aforementioned range. Although a vapor deposition method was used as the metal film-forming method, there may be used another method such as a sputtering method, a laser annealing method as means for raising the temperature instantaneously to the melting point of the metal to be formed, or a plating method.

The invention is not limited to the description of the embodiment at all. Various modifications that can be easily conceived by those skilled in the art may be included in the invention without departing from the scope of claim for a patent.

What is claimed is:

1. An electrode for a p-type Group III nitride compound semiconductor layer, comprising:
   a film including a polycrystalline metal disposed on said Group III nitride compound semiconductor layer,
   wherein said polycrystalline metal comprises a transition metal, and
   wherein said polycrystalline metal comprises a fiber structure in which crystal planes of crystal grains are oriented.

2. An electrode for a p-type Group III nitride compound semiconductor layer according to claim 1, wherein said polycrystalline metal comprises large crystal grains.

3. An electrode for a p-type Group III nitride compound semiconductor layer, comprising:
   a film including a polycrystalline metal disposed on said Group III nitride compound semiconductor layer,
   wherein said polycrystalline metal comprises a transition metal, and
   wherein the polycrystalline metal comprises a fiber structure in which a crystal grain boundary density decreases such that a quantity of defects in the metal/semiconductor boundary decreases.

4. The electrode according to claim 1, wherein a percentage of oriented crystal grains occupying said fiber structure is increased to provide an increase of an orientation force of the metal film.

5. The electrode according to claim 1, wherein said fiber structure comprises a predetermined percentage of oriented crystal grains to provide a predetermined orientation force of the metal film.

6. An electrode for a p-type Group III nitride compound semiconductor layer, comprising:
   a film including a polycrystalline metal disposed on said Group III nitride compound semiconductor layer,
   wherein said polycrystalline metal comprises a transition metal, and
   wherein the polycrystalline metal comprises a fiber structure including oriented crystal faces including closed packed planes.

7. An electrode for a p-type Group III nitride compound semiconductor layer, the electrode comprising:
   a polycrystalline metal film disposed on said p-type Group III nitride compound semiconductor layer to form a metal/semiconductor boundary,
   wherein said polycrystalline metal film comprises a fiber structure in which a crystal grain boundary density decreases such that a quantity of defects in the metal/semiconductor boundary decreases, and wherein said polycrystalline metal film comprises a transition metal.

8. The electrode according to claim 7, wherein said fiber structure of said polycrystalline metal film comprises oriented crystal planes of crystal grains.

9. The electrode according to claim 7, wherein said polycrystalline metal comprises crystal gains of a predetermined large size.

10. The electrode according to claim 8, wherein a percentage of oriented crystal grains occupying said fiber structure is increased to provide an increase of an orientation force of the metal film.

11. The electrode according to claim 7, wherein the polycrystalline metal comprises a fiber structure including oriented crystal faces including closed packed planes.

12. The electrode according to claim 7, wherein said p-type Group III nitride compound semiconductor layer comprises one of GaN, AlGaN, and GaInN.

13. The electrode according to claim 7, wherein said polycrystalline metal comprises one of platinum (Pt), nickel (Ni), palladium (Pd), chromium (Cr), and iron (Fe).

14. The electrode according to claim 7, wherein a degree of said crystal grains of said predetermined large size is no less than a thickness of said polycrystalline metal film.

15. A p-type Group III nitride compound semiconductor light-emitting device, comprising:
   an electrode including a polycrystalline metal film disposed on a p-type Group III nitride compound semiconductor layer of said light-emitting device to farm a metal/semiconductor boundary,
   wherein said polycrystalline metal film comprises a fiber structure in which a crystal grain boundary density decreases such that a quantity of defects in the metal/semiconductor boundary decreases, and
   wherein said polycrystalline metal film comprises a transition metal.

16. The device according to claim 15, wherein said fiber structure of said polycrystalline metal film comprises oriented crystal planes of crystal grains.

17. The device according to claim 15, wherein said polycrystalline metal comprises crystal grains of a predetermined large size.

18. An electrode for a p-type Group III nitride compound semiconductor layer, comprising:
   a film including a polycrystalline metal disposed on said Group III nitride compound semiconductor layer,
   wherein said polycrystalline metal comprises a transition metal, and
   wherein said polycrystalline metal comprises one of platinum (Pt), nickel (Ni), palladium (Pd), chromium (Cr), and iron (Fe).

19. The p-type Group III nitride compound semiconductor light-emitting device according to claim 15, wherein said polycrystalline metal comprises one of platinum (Pt), nickel (Ni), palladium (Pd), chromium (Cr), and iron (Fe).

20. An electrode for a p-type Group III nitride compound semiconductor layer, comprising:
   a film including a polycrystalline metal disposed on said Group III nitride compound semiconductor layer,
   wherein said polycrystalline metal comprises a transition metal, and
   wherein said film is disposed directly on said p-type Group III nitride compound semiconductor layer.

* * * * *